United States Patent
Lewkow (10) Patent No.: US 9,515,112 B2
(45) Date of Patent: Dec. 6, 2016

(54) DEVICES AND METHODS FOR PROVIDING SELECTABLE FIELD OF VIEW FUNCTIONALITY BY PROVIDING AN OPTICAL ELEMENT INTO AND OUT OF AN OPTICAL RECEIVING PATH

(71) Applicant: Google Inc., Mountain View, CA (US)

(72) Inventor: Roman Lewkow, Mountain View, CA (US)

(73) Assignee: Google Inc., Mountain View, CA (US)

( * ) Notice: Subject to any disclaimer, the term of this patent is extended or adjusted under 35 U.S.C. 154(b) by 441 days.

(21) Appl. No.: 13/854,997

(22) Filed: Apr. 2, 2013

(65) Prior Publication Data

US 2014/0291498 A1 Oct. 2, 2014

(51) Int. Cl.
*H01L 27/146* (2006.01)

(52) U.S. Cl.
CPC ... *H01L 27/14625* (2013.01); *H01L 27/14618* (2013.01); *H01L 2924/0002* (2013.01)

(58) Field of Classification Search
CPC .............................. G03B 17/12; G03B 3/02
USPC ............. 250/201.2; 396/73, 74, 75, 348–350
See application file for complete search history.

(56) References Cited

U.S. PATENT DOCUMENTS

| | | | |
|---|---|---|---|
| 3,903,537 A | 9/1975 | Ettischer | |
| 4,887,107 A | 12/1989 | Nakamura et al. | |
| 6,134,393 A * | 10/2000 | Melman | 396/429 |
| 6,501,909 B1 * | 12/2002 | Nishimura et al. | 396/74 |
| 7,619,654 B2 * | 11/2009 | Ito | G02B 27/646 |
| | | | 348/208.11 |
| 7,747,155 B1 * | 6/2010 | Gutierrez | 396/73 |
| 7,785,021 B2 * | 8/2010 | Kato | 396/348 |
| 2011/0299844 A1 | 12/2011 | Hsieh et al. | |
| 2012/0026360 A1 | 2/2012 | Imamura | |
| 2012/0194728 A1 | 8/2012 | Kim | |
| 2013/0028581 A1 * | 1/2013 | Yeung et al. | 396/75 |
| 2013/0064533 A1 | 3/2013 | Nakata | |

FOREIGN PATENT DOCUMENTS

| | | |
|---|---|---|
| JP | 4162946 | 8/2008 |
| KR | 10-2011-0071550 | 6/2011 |

OTHER PUBLICATIONS

International Search Report and Written Opinion prepared by the Korean Patent Office in International Patent Application Serial No. PCT/US2014/018510, mailed Jul. 11, 2014.

(Continued)

*Primary Examiner* — Renee Chavez
(74) *Attorney, Agent, or Firm* — McDonnell Boehnen Hulbert & Berghoff LLP (57) ABSTRACT

Within examples, devices and methods for providing optical element field of view functionality by providing an optical element into and out of an optical receiving path are described. In one example, a device is provided that comprises an imager die having an optical receiving path, and an actuator coupled to an optical element and configured to cause a change in a position of the optical element into and out of the optical receiving path of the imager die. The actuator is configured to cause the change in the position of the optical element to change a given field of view setting of the device. In some examples, a device may be configured to include dual-setting field of view functionality.

4 Claims, 5 Drawing Sheets

(56) References Cited

OTHER PUBLICATIONS

International Preliminary Report on Patentability and Written Opinion prepared by the Korean Patent Office in International Patent Application Serial No. PCT/US2014/018510, mailed Oct. 15, 2015.

* cited by examiner

DEVICES AND METHODS FOR PROVIDING SELECTABLE FIELD OF VIEW FUNCTIONALITY BY PROVIDING AN OPTICAL ELEMENT INTO AND OUT OF AN OPTICAL RECEIVING PATH

BACKGROUND

Unless otherwise indicated herein, the materials described in this section are not prior art to the claims in this application and are not admitted to be prior art by inclusion in this section.

Imaging systems typically have a fixed field of view. In practical use, when working with natural scenes, it may be desirable to modify a field of view of the imaging system to bring elements of the scene that are of interest into the picture. A field of view may be related to a focal length of the imaging system (field of view and focal length are sometimes used interchangeably). A change of the field of view of the imaging system is sometimes referred to as zoom and a resulting focal length of the imaging system is referred to as a zoom setting.

Traditional zoom-capable imaging devices (still cameras, camcorders) typically adjust the field of view by moving internal elements of a camera lens along the optical axis of the assembly. A camera lens is an optical lens or an assembly of lenses used with a camera body to capture images of objects. In some examples, example camera lens may include a lens assembly that is within an optical path of an imager die, and is coupled to an actuator to change a field of view setting of the lens assembly within the optical path. The actuator coupled to the lens assembly may consume power to accomplish the change in field of view. The actuator may continue to consume power to retain the lens assembly in the field of view setting. In some examples, an additional actuator or actuators may be used to change the focus setting of the optical assembly.

SUMMARY

Within examples, devices and methods for providing selectable field of view functionality by providing an optical element into and out of an optical receiving path are described.

In one example, a device is provided that comprises an imager die having an optical receiving path, and an actuator coupled to an optical element and configured to cause a change in a position of the optical element into and out of the optical receiving path of the imager die. The actuator is configured to cause the change in the position of the optical element to change a given field of view setting of the device.

In another example, another device is provided that comprises an imager die having an optical receiving path, and a lens assembly having a frame configured to support one or more optical elements. The lens assembly is positioned such that the one or more optical elements are within the optical receiving path of the imager die. The device also comprises an actuator coupled to an additional optical element and configured to cause a change in a position of the additional optical element into and out of the optical receiving path of the imager die so that a direction of movement of the additional optical element is substantially perpendicular to the optical receiving path of the imager die. The actuator is configured to cause the change in the position of the additional optical element to change a given field of view setting of the device.

In another example a method is provided that comprises providing an imager die having an optical receiving path, and causing an actuator coupled to an optical element to change a position of the optical element into and out of the optical receiving path of the imager die. The change in the position of the optical element causes a change in a given field of view setting of the device.

In still another example, a device is provided comprising a means for providing an imager die having an optical receiving path, and means for causing an actuator coupled to an optical element to change a position of the optical element into and out of the optical receiving path of the imager die. The change in the position of the optical element causes a change in a given field of view setting of the device.

These as well as other aspects, advantages, and alternatives, will become apparent to those of ordinary skill in the art by reading the following detailed description, with reference where appropriate to the accompanying figures.

DETAILED DESCRIPTION

The following detailed description describes various features and functions of the disclosed systems and methods with reference to the accompanying figures. In the figures, similar symbols identify similar components, unless context dictates otherwise, and the figures or components of the figures may not necessarily be drawn to scale for illustration purposes. The illustrative system and method embodiments described herein are not meant to be limiting. It may be readily understood that certain aspects of the disclosed systems and methods can be arranged and combined in a wide variety of different configurations, all of which are contemplated herein.

Within examples, a device is provided that is configured to provide predefined focal length settings. For example, a dual-setting lens may be configured as a wide angle setting and a narrow angle setting, while a three-way design may offer additional focal length setting in between.

In some examples, change of the focal length between two (or more) fixed settings may include moving a lens element into and out of an optical path of an imager die. Such movement of the lens element may be caused by an additional actuator provided in the device, active only while the element is being moved (to reduce power consumption), for example. Thus, a device may include an imager die that has an optical receiving path, and an actuator coupled to an optical element and configured to cause a change in a position of the optical element into and out of the optical receiving path of the imager die. A direction of movement of the optical element may be substantially perpendicular the optical receiving path of the imager die.

In other examples, the device may further include another optical element and another actuator that is configured to cause a change in a position of the other optical element into and out of the optical receiving path of the imager die. Each actuator may be configured to operate independently, so that one, both, or none of the optical elements are within the optical receiving path to offer many more field of view settings. In still other examples, the device can further include a lens carrier coupled to a plurality of optical elements, and the actuator can cause a change in position of the plurality of optical elements in a rotary motion so as to move the plurality of optical elements into and out of the optical receiving path of the imager die. The lens carrier may be in a form of a carousel that supports multiple lens elements, and each lens element provides a different focal length modifier, for example.

Within yet further examples, the device may also include a lens assembly that has a frame configured to support one or more optical elements, and another actuator configured to move the lens frame within the optical receiving path. A direction of movement of the lens assembly can be substantially perpendicular to a direction of movement of the first optical element, and thus, the movement of the lens assembly may include actuation along the optical axis of the assembly to produce a variable focus setting (e.g., for auto-focus functions). Thus, example devices may be configured to adjust a field of view (or focal length) in addition to adjust a focus setting. These two adjustments are independent of each other, and modification of the field of view of the lens may include a discrete (rather than continuous) zoom function modification.

Figure 1A:
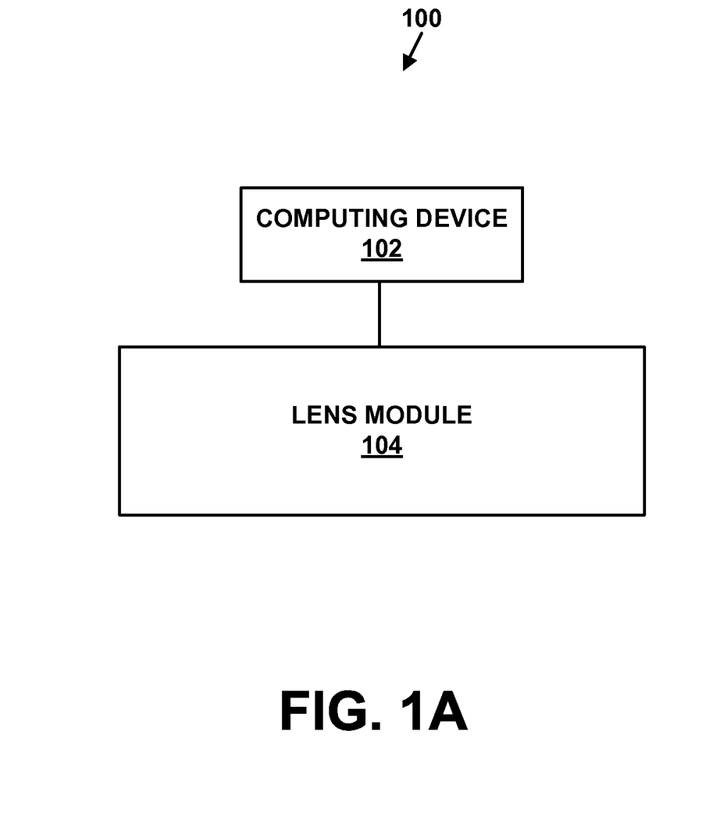
FIG. 1A illustrates a block diagram of an example device.

Referring now to the figures, FIG. 1A illustrates a block diagram of an example device 100. The device 100 may include a computing device 102 that is coupled to a lens module 104. The computing device 102 may be coupled to the lens module 104, for example, mechanically, through electrical circuitry, or by using electrical cables. The computing device 102 and the lens module 104 are shown to be separate components of the device 100.

The computing device 102, for example, may be or may include a camera, a handheld device, a computer, a head-mounted device, or other wearable computing device. In some examples, the computing device 102 may include a battery to provide power to the computing device 102 and the lens module 104. In other examples, the computing device 102 may receive power from a power unit and provide power to the lens module 104.

The lens module 104 may include one or more image sensors that receive light focused by a plurality of optical element assemblies included in the lens module 104. In other examples, the image sensor may be included in the computing device 102. The lens module 104 may also include a first actuator configured to change the position of the lens module 104 or change a position of a component of the lens module 104 to a position corresponding to one of a plurality of focus settings, which can be predetermined focus settings (i.e., finite number) or a setting along a continuous range of settings. The lens module 104 may also be configured to change a position of a component of the lens module 104 to change a field of view setting of the device 100.

The device 100 may be configured to receive light from the lens module 104 and provide data indicative of an image represented by the light. In some examples, the device 100 may store the data as well or provide the data to a display that may be included in the device 100.

Figure 1B:
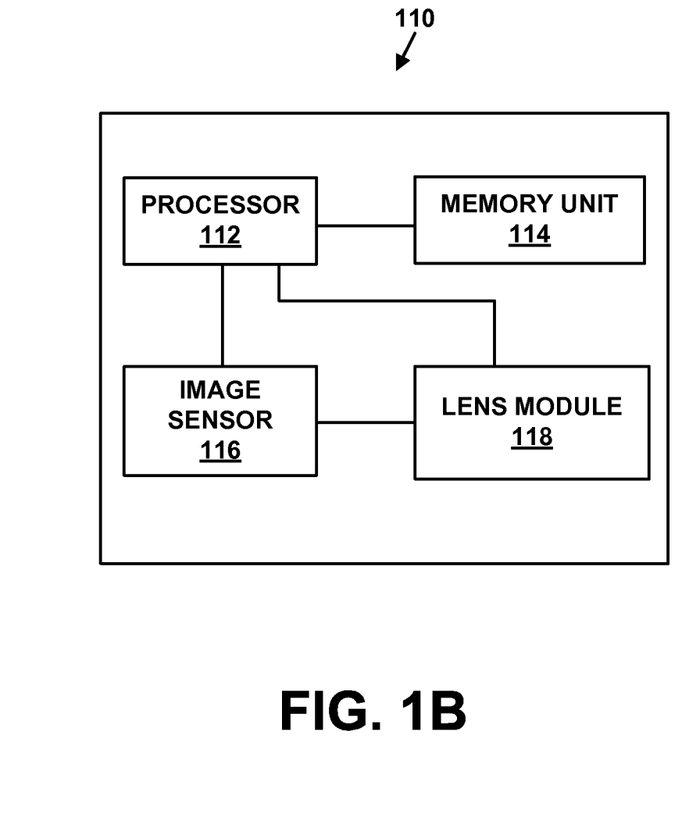
FIG. 1B illustrates another embodiment of an example device.

FIG. 1B illustrates another embodiment of an example device 110. The device 110 may include a processor 112, a memory unit 114 and an image sensor 116 to facilitate processing and storage of data from the image sensor 116. The image sensor 116, for example, is coupled to a lens module 118 that is shown included in the device 110, which may be configured to receive light from the lens module 118.

The device 110, for example, may be or may include a camera, a handheld device, a computer or a head-mounted device, or other wearable computing device. In some examples, the device 110 may include a battery to provide power to the device 110 and components included in the device 110. In other examples, the device 110 may receive power from a power unit and provide power to the components included in the device 110. For example, the device 110 may include the processor 112, the memory unit 114, the image sensor 116, and the lens module 118. The device 110, for example, may also include other circuitry (not shown) including at least one driver for the lens module 118.

The processor 112, for example, may be configured to receive data from the image sensor 116 indicative of an image determined by the image sensors 116. The processor 112 may further process the data and provide the data for storage in memory unit 114. The processor 112 may also process the data and provide the processed data to a display (not shown). The processor 112 may also be configured to provide instructions for other components in the device 110 to facilitate capturing the image at a correct focus or a correct field of view. The instructions may include instructions to drive the lens module 118 to provide a given field of view setting from a plurality of field of view settings that corresponds to a desired field of view.

The memory unit 114 included in FIG. 1B may include, for example, static memory or a media storage device. For example, the memory unit 114 may comprise an SD card or a USB memory device. The memory unit 114 may also be configured, for example, to store image data provided by the processor 112 and to provide image data stored on the memory unit 114 to the processor 112. The memory unit 114 may also comprise chemical storage. For example, a photography film may be utilized to chemically store the image data.

The image sensor 116 included in FIG. 1B may include, for example, an array of semiconductor pixel sensors (e.g., a CMOS image sensor or a similar device) configured to receive light from the lens module 118 and provide data representative of an image indicated by the light. In other examples, the image sensor 116 may be a charge-coupled device (CCD). The image sensor 116 may be coupled to a printed circuit board and aligned with optical axes of optical element assemblies included in the lens module 118.

The lens module 118 may include one or more optical element assemblies. The one or more optical element assemblies project light entering the lens module 118 onto the image sensor 116. The lens module 118 may be configured to change a focus setting or additionally a field of view setting due to instructions received from processor 112. The lens module 118 may have a fixed position within the device 110, or some components of the lens module 118 may have a fixed position and other components may be configured to change positions so that a focus setting and/or a field of view setting of the device 110 can be changed by changing a position of components of the lens module 118, for example.

The device 110 may be configured to receive light projected by the lens module 118 onto the image sensor 116 and provide data indicative of an image represented by the light to the processor 112. For example, the device 110 may utilize the processor 112 to configure the lens module 118 to a given focus setting, or to a given field of view setting as well. The processor 112 may then utilize the image sensor 116 to capture an image produced by lens module 118 and store the image in the memory unit 114. In other examples, the device 110 may utilize processor 112 to process data representing the captured image or retrieve data from memory unit 114, process the data, and provide data for display.

Figure 2A:
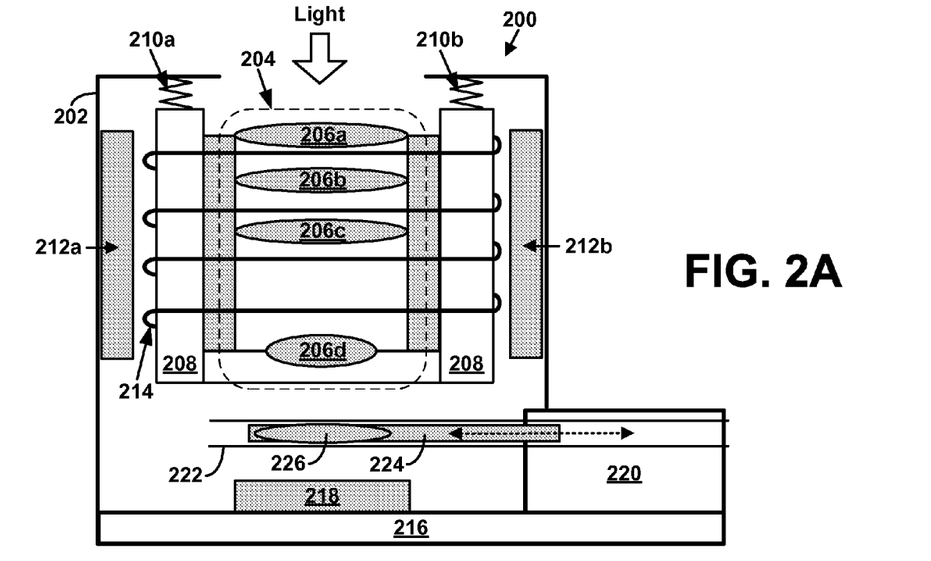
FIG. 2A illustrates a side view cross-section of an example device that may be configured as a camera module.

FIG. 2A illustrates a side view cross-section of an example device 200 that may be configured as a camera module. The device 200 may include an enclosure structure 202 that houses the various components of the device 200. The device 200 includes an optical element assembly 204 including a plurality of optical elements 206a-d that is coupled to a frame 208. The frame 208 is coupled to the enclosure structure 202 by springs 210a-b. The device 200 also includes magnets 212a-b that provide a first magnetic field through the frame 208. The frame 208 is also coupled to an electromagnetic coil 214 that provides a controlled second magnetic field through the frame 208. The device 200 also includes a module base 216 (e.g., a printed circuit board (PCB)) that is coupled to an imager die 218 and an actuator 220.

The enclosure structure 202 included in the device 200 may comprise a plastic, metal or composite structure. The enclosure structure 202 may be included in a computing device (not shown) coupled to the device 200 or may be independent of the computing device. In some examples, the enclosure structure 202 may have the shape of a cube, a cylinder, or other shape.

The plurality of optical elements 206a-d included in the optical element assembly 204 may comprise lens, mirrors, prisms, filters or any other component that is configured to manipulate light passing through the one or more optical elements. Light may be focused, for example, due to a diffraction property or a reflective property of the one or more optical elements, or its spectral characteristics may be modified by filters.

The imager die 218 may include one or more image sensors, for example, including an array of semiconductor pixel sensors (e.g., CMOS image sensors or similar devices) configured to receive light and to provide data indicative of the light. In other examples, the imager die 218 may be a charge-coupled device (CCD). The imager die 218 may be a component provided on a printed circuit board (PCB). In some examples, the imager die 218 may be aligned with optical axes of the optical element assembly 204.

In the device 200, the optical element assembly 204 is configured in a spatial arrangement with the imager die 218 such that light can be focused onto the imager die 218 according to one of a plurality of focus settings (either predetermined or continuous focus setting). In FIG. 2A, the optical element assembly 204 may be configured to move in a direction parallel to an optical axis of the imager die 218 (e.g., shown in FIG. 2 as an axis along which light is received). The optical element assembly 204 may move up and down, or closer to and farther away from the imager die 218. In some examples, the optical element assembly 204 may also be configured to move in a direction perpendicular to the optical axis of the imager die 218 (or side to side). In still other examples, the optical element assembly 204 may also be configured to move both parallel to and perpendicular to an optical axis so as to move generally diagonal with respect to the optical axis. The optical element assembly 204 may be configured to move through actuation of at least one of the magnets 212a-b, the electromagnetic coil 214, and the springs 210a-b. More generally, the device 200 may move the optical element assembly 204 using these components configured as a voice coil motor (VCM). In other examples, alternative actuators (other than those configured as a VCM) may be used to move the optical element assembly 204, such as manual actuators (through sliding assembly configurations), MEMS, shape memory materials, or other actuators, for example.

Thus, in one example operation, the device 200 includes the lens frame 208, supported by the lens springs 210a-b above the imager die 218, and the electromagnet coil 214 placed on the lens frame 208 is energized by a coil driver (not shown) to produce a controlled magnetic field in the electromagnet coil 214 that interacts with a magnetic field produced by the magnets 212a-b placed around the lens frame 208. The magnetic field interaction produces a force proportional to an amount of current driven through the electromagnet coil 214 that force combines with spring force to move the lens frame 208 closer to or farther from the imager die 218. A change in position of the lens frame 208 causes a change in position of the optical element assembly 204 resulting in a change in an effective focus position (lens closer to the imager die 218 produces far focus, lens away from the imager die 218 produces near focus). The electromagnet coil 214 consumes power, which is position-dependent (typically no power for far focus, with lens frame position maintained by springs, and increasing coil current for closer focus settings). In some examples, a position retention structure may be added to reduce or eliminate holding power draw of the actuator 214.

In other example operations, the actuator 220 includes guide rails 222 within which a lens element carrier 224 resides. The lens element carrier 224 may include an additional lens element 226. The lens element 226 may be a single optical component or an assembly comprising a plurality of optical components. The lens element carrier 224 may be actuated by the actuator 220 to slide within the guide rails 222 to move in a horizontal direction as shown in FIG. 2A so as to move the lens element 226 into and out of an optical path of the imager die 218. The optical path (or optical receiving path) of the imager die 218 may include a path in which light is received through the optical element assembly 204. The guide rails 222 may be positioned outside of the optical path. Thus, the lens element 226 can be moved into the optical path to change a magnification factor, and thus, the field of view of the imager die 218, and also can be moved out of the optical path to change a field of view of the imager die 218 to the other setting. The lens element carrier may move in a direction perpendicular (or substantially perpendicular) to the optical path (or optical axis of the device 200), thus placing the lens element 226 in or out of the optical path. The lens element carrier 224 is configured to be actuated in a linear fashion back and forth so that two field of view settings are provided to the device 200 including when the lens element 226 is within or out of the optical path.

In some examples, the device 200 thus includes two actuators, where one actuator (e.g., voice coil motor) is configured to move the optical element assembly 204 within the optical receiving path causing a change in position of the one or more optical elements 206a-d with respect to the imager die, and the other actuator may be the actuator 220 that causes movement of the lens element 226 into and out of the optical receiving path of the imager die 218. Either of the actuators may be active or powered only during movement of the lens elements, and may be inactive once the lens elements are in a desired position. The optical element assembly 204 may move in a direction of movement that is substantially perpendicular to a direction of movement of the lens element 226. In another example, the optical element assembly 204 may move in a direction of movement that is substantially parallel to the optical receiving path of the imager die 218.

The actuator 220 may slide the lens element carrier 224 within the guide rails 222 using mechanical force by pushing or pulling the lens element carrier 224 which can be electrically initiated to cause the movement, or using magnetic forces (similar to operation of movement of the optical element assembly 204), or possibly through manually applied force as well (such as a slider button that a user may use to slide the lens element carrier 224 within the guide rails 222). In other examples, other actuation techniques may be used, such as pneumatic, shape memory materials, etc.

Figure 2B:
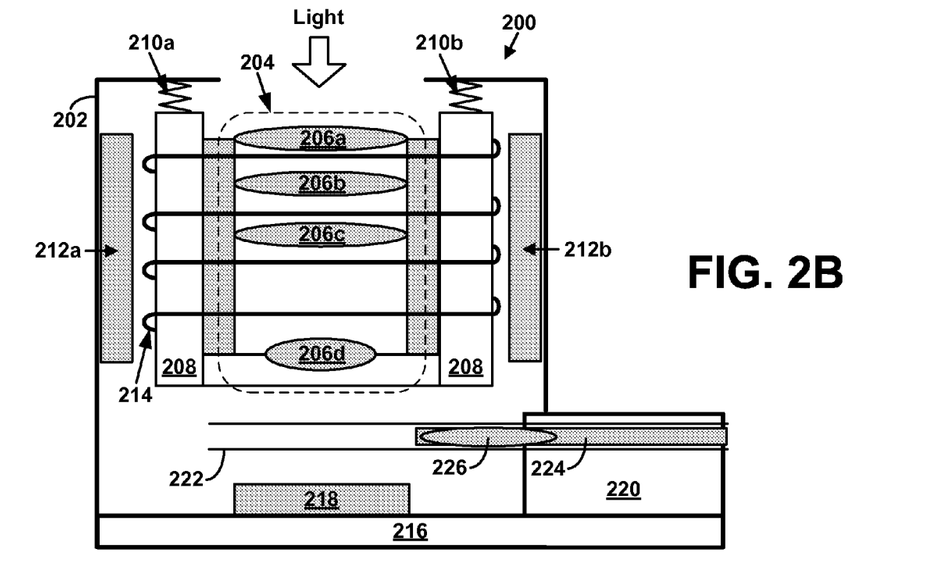
FIG. 2B illustrates another side view cross-section of the device of FIG. 2A.

In FIG. 2A, the lens element 226 is shown as being positioned within the optical receiving path of the imager die 218. FIG. 2B illustrates another side view cross-section of the device 200. In FIG. 2B, the lens element 226 is shown as being positioned out of the optical receiving path of the imager die 218.

The device 200 in FIG. 2A may be configured, in some examples, to operate as a dual focal length camera module with a linearly-actuated focal-length actuator 220 for modifying the additional lens element 226. The dual focal lengths may correspond to a wide angle setting and a narrow angle setting of the device 200. In some examples, the actuator is configured to cause the change in the position of the lens element 226 to provide a non-continuous variable field of view setting of the device 200, such that either the wide angle or narrow angle field of view setting is provided.

The lens element 226 may be provided outside of the optical element assembly 204 that is fixed within the optical path of the imager die 218, and may have optical properties to modify an overall focal length of the device 200 (and the field of view (zoom setting) of the device 200). The optical element assembly 204 may be configured to provide a first set of optical adjustments, and the lens element 226 may be configured to provide different optical adjustments. The lens element 226 may comprise multiple elements, such as glass or plastic, and may be spherical or aspherical, for example.

In other examples, the lens element 226 may be positioned partially within the optical receiving path and partially outside of the receiving path, so as to provide unique optical settings where a portion of light is provided and other portions are not provided onto the imager die 222.

In some examples, all components of the device 200 may be included in the enclosure structure 202 including the actuator 220, the guide rails 222, the lens element carrier 224 and the lens element 226. In other examples, the actuator 220, the guide rails 222, the lens element carrier 224 and the lens element 226 may be provided coupled to the device 220, such that the guide rails 222, the lens element carrier 224 and the lens element 226 are inserted into an opening of the enclosure structure 202.

Figure 3:
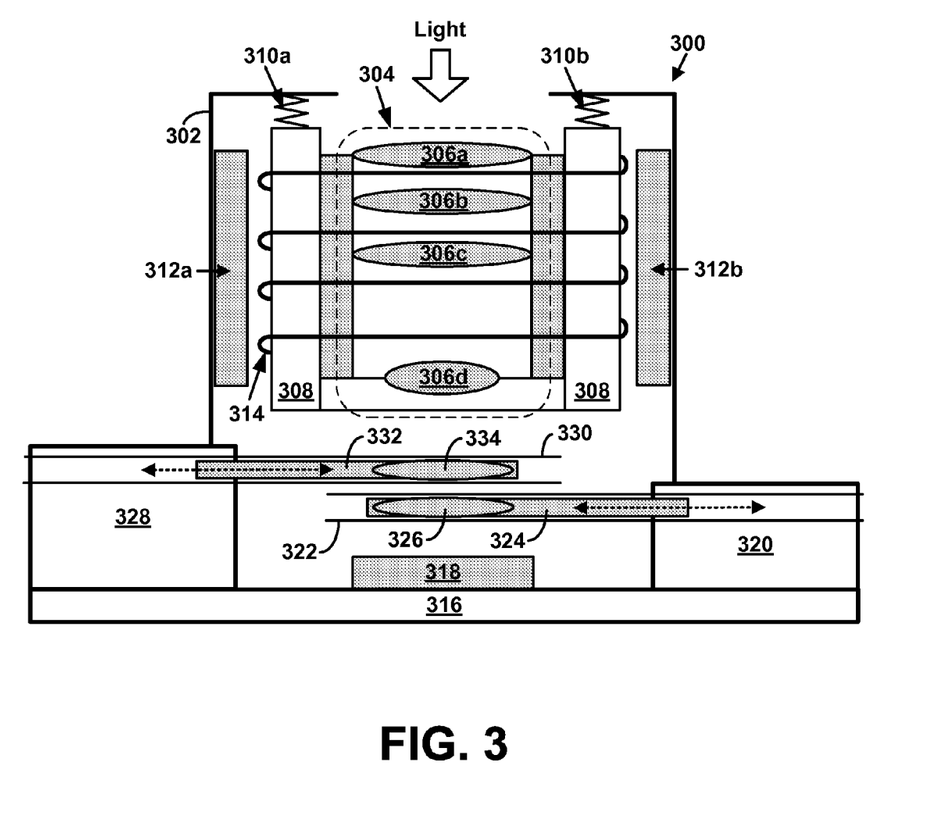
FIG. 3 illustrates a side view cross-section of another example device that may be configured as a camera module.

FIG. 3 illustrates a side view cross-section of another example device 300 that may be configured as a camera module. The device 300 may include an enclosure structure 302 that houses the various components of the device 300. The device 300 includes an optical element assembly 304 including a plurality of optical elements 306a-d that is coupled to a frame 308. The frame 308 is coupled to the enclosure structure 302 by springs 310a-b. The device 300 also includes magnets 312a-b that provide a first magnetic field through the frame 308. The frame 308 is also coupled to an electromagnetic coil 314 that provides a controlled second magnetic field through the frame 308. The device 300 also includes a module base 316 (e.g., a printed circuit board (PCB)) that is coupled to an imager die 318 and an actuator 320, and the actuator 320 includes guide rails 322 within which a lens element carrier 324 resides. The lens element carrier 324 may include an additional lens element 326. Components in the device 300 may be similar to components of the device 200 in FIG. 2, such as the enclosure structure 302, the imager die 318, etc.

The device 300 also includes another actuator 328 that includes guide rails 330 within which a lens element carrier 332 resides. The lens element carrier 332 may include an additional lens element 334. In the example shown in FIG. 3, two separate lens elements can be moved independently within and out of the optical receiving path of the imager die 318. There may be multiple field of view setting arrangements that can result due to movement of the lens elements 326 and 334 including both lens elements 326 and 334 out of the optical path, the lens element 326 in the optical path with the lens element 334 out of the optical path, the lens element 334 in the optical path with the lens element 326 out of the optical path, or both the lens elements 326 and 334 in the optical path. In some examples, the device 300 can be configured to provide many field of view settings narrow/wide that substantially equate to a nearly continuous zoom. Each of the lens element 334 and the lens element 326 may be the same or may be different to offer further unique field of view settings. The lens elements 326 and 324 may be single optical components or assemblies comprising a plurality of optical components.

Thus, in FIG. 3, the two additional lens elements 326 and 334 are provided outside of the main optical element assembly 304, to provide additional focal length settings. The lens elements 326 and 334 may be actuated independently of one another (i.e., both out, only upper in, only lower in) or also jointly (i.e., both out, only upper in, only lower in, both in), and each lens element carrier 324 and 332 may be actuated by an actuator.

Each of the first actuator 320 and the second actuated 328 may be provided within the enclosure structure 302, or portions of the first actuator 320 and the second actuated 328 may be provided outside of the enclosure structure 302 as well.

In the example shown in FIG. 3, the actuator 314 may be configured to move the optical element assembly 304 within the optical path of the imager die 318 to adjust a focus setting of the device, and the actuators 320 and 328 are configured to move the lens elements 326 and 334, respectively, into and out of the optical path of the imager die 318 so as to adjust a field of view of the device 300.

Figure 4:
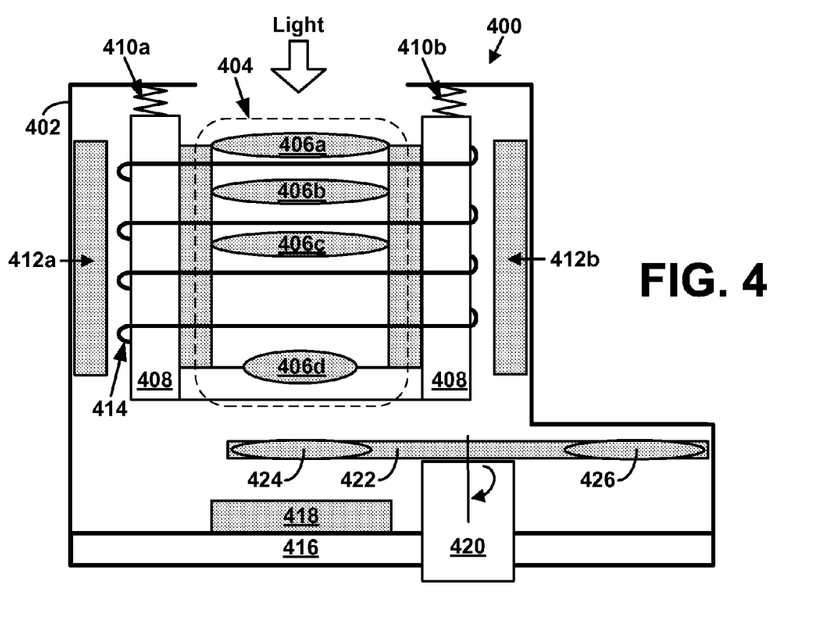
FIG. 4 illustrates a side view cross-section of another example device that may be configured as a camera module.

FIG. 4 illustrates a side view cross-section of another example device 400 that may be configured as a camera module. The device 400 may include an enclosure structure 402 that houses the various components of the device 400. The device 400 includes an optical element assembly 404 including a plurality of optical elements 406a-d that is coupled to a frame 408. The frame 408 is coupled to the enclosure structure 402 by springs 410a-b. The device 400 also includes magnets 412a-b that provide a first magnetic field through the frame 408. The frame 408 is also coupled to an electromagnetic coil 414 that provides a controlled second magnetic field through the frame 408. The device 400 also includes a module base 416 (e.g., a printed circuit board (PCB)) that is coupled to an imager die 418 and an actuator 420, and the actuator 420 is coupled to a lens element carrier 422 upon which an additional lens elements 424 and 426 reside. Components in the device 400 may be similar to components of the device 200 in FIG. 2, such as the enclosure structure 402, the imager die 418, etc.

In the device 400, the actuator 420 may be configured to cause a change in position of the lens elements 424 and 426 in a rotary motion so as to move the lens elements 424 and 426 into and out of the optical receiving path of the imager die 418. Thus, in this example, instead of a sliding actuator, the actuator 420 may be configured as a carousel that rotates the lens element carrier 422. The lens element carrier 422 may include multiple lens elements (shown in FIG. 4 as including two; however, more than two may be included). For example, the lens element carrier 422 may be a rectangular shape to include a lens element on each end.

In another example, the lens element carrier 422 may be a cross shape to have up to four lens elements on each end. The lens element carrier 422 may also be a circular disc, and can have any number of lens elements (depending on shapes and sizes) positioned on an edge of the disc along a perimeter of the disc. When multiple lens elements are provided, each may be configured differently so as to provide a different focal length modifier for the device 400 based on the number of lens elements included on the lens element carrier 424. In other examples, other elements in addition to or rather than a lens element for modifying focal lengths can be included on the lens carrier 424, such as spectral filters for example. The lens elements 424 and 426 may be single optical components or assemblies comprising a plurality of optical components.

In some examples, the actuator 420 may be configured to move the lens element carrier 424 to a selected position so as to move a lens element into the optical receiving path of the imager die 418. One of the selectable positions of the lens element carrier 424 may be an empty hole or may include no lens element such that zero or one of a plurality of elements on the lens element carrier 424 can be positioned within the optical receiving path of the imager die 418 at any given time.

Figure 5A:
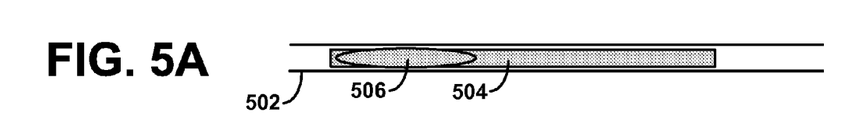
FIGS. 5A-5C illustrate example lens carrier element configurations.
Figure 5B:
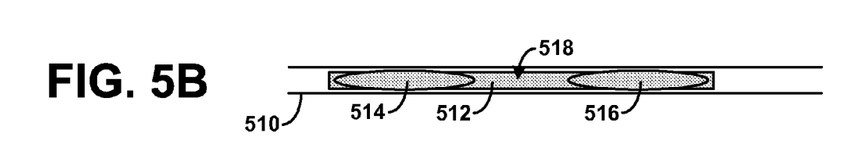
Figure 5C:
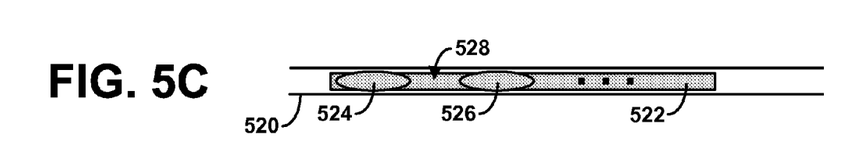

FIGS. 5A-5C illustrate example lens carrier element configurations. Any of the lens carrier element configurations shown in FIGS. 5A-5C may be used or implemented within any of the devices shown in FIGS. 1-3, for example.

FIG. 5A illustrates guides rails 502 within which a lens carrier 504 is provided. A lens element 506 is provided on the lens carrier 504. The configuration shown in FIG. 5A is similar to or the same as that described in FIGS. 2A-2B, for example.

FIG. 5B illustrates guides rails 510 within which a lens carrier 512 is provided. A lens element 514 and a second lens element 516 are provided on the lens carrier 510. A space 518 is provided between the lens element 514 and the lens element 516. In operation, the lens carrier 510 may slide within the guide rails 510 to move positions of the lens element 514, the lens element 516, and the space 518, such that one of them can be within an optical receiving path of an imager die. Using the configuration shown in FIG. 5B, three different focal length settings may be possible using a single rail and actuator assembly.

FIG. 5C illustrates guides rails 520 within which a lens carrier 522 is provided. Multiple lens elements 524 and 526 are provided on the lens carrier 522, and a space 528 is provided between the lens elements 524 and 526. In operation, the lens carrier 522 may slide within the guide rails 520 to move positions of the lens elements 524 and 526, and the space 528 so that one of them can be within the optical receiving path of an imager die. Using the configuration shown in FIG. 5C, multiple different focal length settings may be possible, since more than two lens elements may be included on the lens carrier 522 depending on size and shape of the lens carrier 522 and the lens elements. In addition, each lens element 524 and 526, and others if present, may be of different optical properties so as to provide possibilities for many different focal length settings or other optical modifications.

Figure 6:
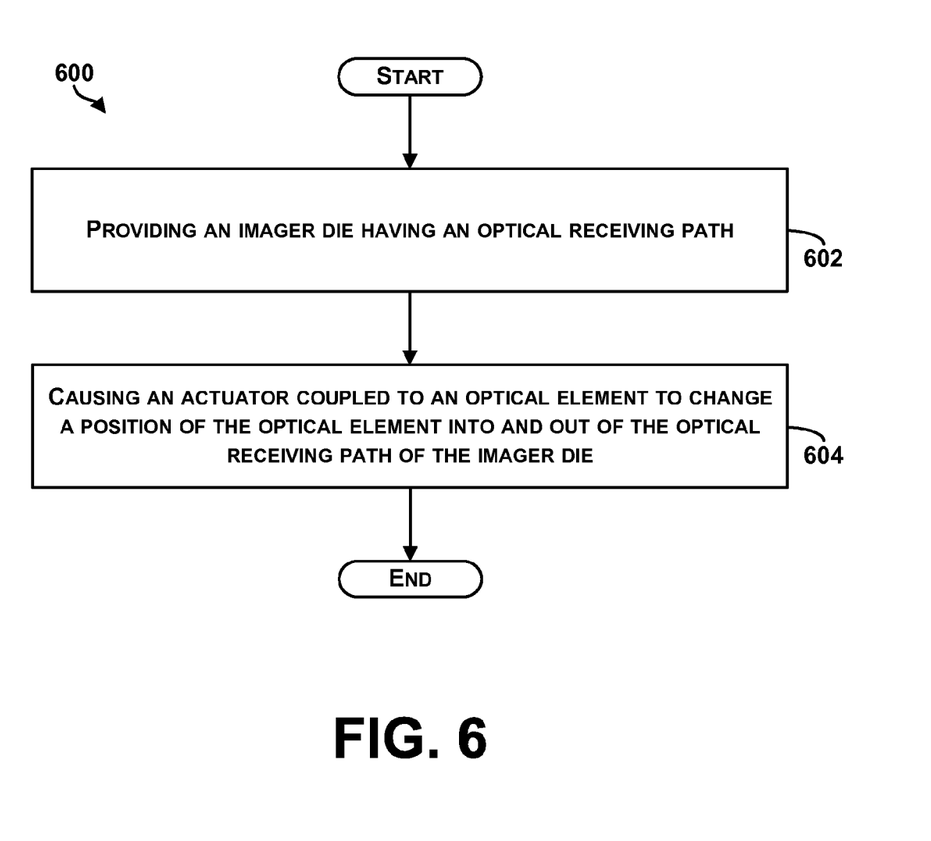
FIG. 6 is a block diagram of an example method for providing field of view settings of a device that includes an optical element assembly, in accordance with at least some embodiments described herein.

FIG. 6 is a block diagram of an example method for providing field of view settings of a device that includes an optical element assembly, in accordance with at least some embodiments described herein. Method 600 shown in FIG. 6 presents an embodiment of a method that could be used with any of the devices shown in any of FIGS. 1-4, for example. Method 600 may include one or more operations, functions, or actions as illustrated by one or more of blocks 602-604. Although the blocks are illustrated in a sequential order, these blocks may in some instances be performed in parallel, and/or in a different order than those described herein. Also, the various blocks may be combined into fewer blocks, divided into additional blocks, and/or removed based upon the desired implementation.

In addition, for the method 600 and other processes and methods disclosed herein, the flowchart shows functionality and operation of one possible implementation of present embodiments. In this regard, each block may represent a module, a segment, or a portion of a manufacturing or operation process.

At block 602, the method 600 includes providing an imager die having an optical receiving path. At block 604, the method 600 includes causing an actuator coupled to an optical element to change a position of the optical element into and out of the optical receiving path of the imager die. The change in the position of the optical element causes a change in a given field of view setting of the device or other optical property of the optical assembly. In one example, causing the actuator to change the position of the optical element cause movement of the optical element in a direction substantially perpendicular to the optical receiving path of the imager die.

Although description of devices herein is directed to camera modules, components of the devices, or the devices themselves may take the form of other devices, such as, for example, imaging devices like document and image scanners, barcode readers, copiers, cameras, video cameras, microscopes, hand-held devices, head-mounted devices, wearable devices or telescopes.

Within examples, techniques that are described for the device can be applied to other electronic devices. For example, projection devices such as displays may process light using the methods described herein. Thus, example methods herein provide techniques that involve an actuator configured to cause a change in a position of one or more optical elements resulting in a given field of view setting of a device.

In addition, within examples described herein, additional elements are described as lens elements configured to modify a focal length of the device. However, other optical functions may be included or provided by the lens elements, such as for example, effects including a change in a field of view (e.g., in combination with a non-actuated main lens assembly, to produce some fixed focal distance selections), optical attenuation, or spectral or artistic filters (e.g., IR pass, starburst, etc.).

It should be understood that arrangements described herein are for purposes of example only. As such, those skilled in the art will appreciate that other arrangements and other elements (e.g. machines, interfaces, functions, orders, and groupings of functions, etc.) can be used instead, and some elements may be omitted altogether according to the desired results. Further, many of the elements that are described are functional entities that may be implemented as discrete or distributed components or in conjunction with other components, in any suitable combination and location, or other structural elements described as independent structures may be combined.

While various aspects and embodiments have been disclosed herein, other aspects and embodiments will be apparent to those skilled in the art. The various aspects and embodiments disclosed herein are for purposes of illustration and are not intended to be limiting, with the true scope being indicated by the following claims, along with the full scope of equivalents to which such claims are entitled. It is also to be understood that the terminology used herein is for the purpose of describing particular embodiments only, and is not intended to be limiting.

What is claimed is:

1. A device comprising:
   an imager die having an optical receiving path;
   a lens assembly having a frame configured to support one or more optical elements, wherein the lens assembly is positioned such that the one or more optical elements are within the optical receiving path of the imager die;
   an actuator for the lens assembly configured to cause a change in position of the lens assembly in a direction of movement that is substantially parallel to the optical receiving path of the imager die;
   a first lens carrier;
   multiple optical elements provided on the first lens carrier and arranged side-by-side in a linear manner;
   first guide rails in which the first lens carrier is positioned, wherein the first guide rails are positioned between the lens assembly and the imager die such that light entering through the optical receiving path passes through the lens assembly and then through one of the multiple optical elements;
   a first actuator coupled to the first lens carrier and configured to slide the first lens carrier linearly within the first guide rails in directions substantially perpendicular to the optical receiving path of the imager die to cause changes in positions of the multiple optical elements into and out of the optical receiving path of the imager die such that one of the multiple optical elements is within the optical receiving path, wherein the first actuator is configured to cause the changes in positions of the multiple optical elements to change a given field of view setting of the device;
   a second lens carrier and a second additional optical element provided on the second lens carrier;
   second guide rails in which the second lens carrier is positioned, wherein the second guide rails are positioned between the first guide rails and the imager die such that light entering through the optical receiving path passes through the lens assembly, then through one of the multiple optical elements, then through the second additional optical element, and received at the imager die; and
   a second actuator coupled to the second additional optical element and configured to cause a change in a position of the second additional optical element into and out of the optical receiving path of the imager die,
   wherein the first actuator is configured to cause the change in the position of the multiple optical elements independent of the second actuator causing the change in the position of the second additional optical element.

2. The device of claim 1, wherein the first actuator is configured to cause the changes in positions of the multiple optical elements to provide a non-continuous variable field of view setting for the device.

3. The device of claim 1, further comprising:
   a housing structure configured to enclose the imager die, the lens assembly, the actuator, and the multiple optical elements.

4. A method comprising:
   providing an imager die having an optical receiving path and a lens assembly having a frame configured to support one or more optical elements, wherein the lens assembly is positioned such that the one or more optical elements are within the optical receiving path of the imager die;
   causing an actuator for the lens assembly to change a position of the lens assembly in a direction of movement that is substantially parallel to the optical receiving path of the imager die;
   providing multiple optical elements on a first lens carrier and arranged side-by-side in a linear manner, and first guide rails in which the first lens carrier is positioned, wherein the first guide rails are positioned between the lens assembly and the imager die such that light entering through the optical receiving path passes through the lens assembly and then through one of the multiple optical elements;
   causing a first actuator coupled to the first lens carrier to slide the first lens carrier linearly within the first guide rails in directions substantially perpendicular to the optical receiving path of the imager die to cause changes in positions of the multiple optical elements into and out of the optical receiving path of the imager die such that one of the multiple optical elements is within the optical receiving path, wherein the changes in positions of the multiple optical elements causes a change in a given field of view setting of the device;
   providing a second lens carrier and a second optical element on the second lens carrier, and second guide rails in which the second lens carrier is positioned, wherein the second guide rails are positioned between the first guide rails and the imager die such that light entering through the optical receiving path passes through the lens assembly, then through one of the multiple optical elements, then through the second optical element, and received at the imager die; and
   causing a second actuator coupled to the second optical element to slide the second optical element into and out of the optical receiving path of the imager die, wherein the second actuator is configured to cause changes in positions of the second optical element independent of the first actuator causing the change in the positions of the of multiple optical elements.

* * * * *